(12) United States Patent
Ong

(10) Patent No.: US 8,711,646 B2
(45) Date of Patent: Apr. 29, 2014

(54) ARCHITECTURE, SYSTEM AND METHOD FOR TESTING RESISTIVE TYPE MEMORY

(75) Inventor: Adrian E. Ong, Pleasanton, CA (US)

(73) Assignee: Samsung Electronics Co., Ltd. (KR)

(*) Notice: Subject to any disclaimer, the term of this patent is extended or adjusted under 35 U.S.C. 154(b) by 153 days.

(21) Appl. No.: 13/466,922

(22) Filed: May 8, 2012

(65) Prior Publication Data
US 2013/0301335 A1 Nov. 14, 2013

(51) Int. Cl.
G11C 29/00 (2006.01)
G11C 5/14 (2006.01)
G11C 11/00 (2006.01)

(52) U.S. Cl.
USPC ........... 365/201; 365/148; 365/158; 365/163; 365/189.09

(58) Field of Classification Search
USPC ........................................................ 365/201
See application file for complete search history.

(56) References Cited

U.S. PATENT DOCUMENTS

| 6,914,838 | B2* | 7/2005 | Baker ........................... 365/205 |
| 7,057,922 | B2* | 6/2006 | Fukumoto ..................... 365/158 |
| 7,609,543 | B2 | 10/2009 | Yang et al. |
| 7,890,892 | B2* | 2/2011 | De Brosse et al. ............... 365/81 |
| 8,004,872 | B2* | 8/2011 | Jung et al. ...................... 365/148 |
| 8,004,875 | B2* | 8/2011 | Siegert et al. .................. 365/148 |
| 2010/0232206 | A1* | 9/2010 | Li et al. .......................... 365/148 |
| 2011/0063898 | A1 | 3/2011 | Ong |
| 2011/0080768 | A1* | 4/2011 | Li et al. .......................... 365/148 |
| 2012/0257437 | A1* | 10/2012 | Seko et al. ...................... 365/148 |
| 2013/0148405 | A1* | 6/2013 | Kang et al. ..................... 365/148 |

* cited by examiner

Primary Examiner — Son Mai
(74) Attorney, Agent, or Firm — Renaissance IP Law Group LLP

(57) ABSTRACT

Example embodiments include a method for massive parallel stress testing of resistive type memories. The method can include, for example, disabling one or more internal analog voltage generators, configuring memory circuitry to use a common plane voltage (VCP) pad or external pin, connecting bit lines of the memory device to a constant current driver, which works in tandem with the VCP pad or external pin to perform massive parallel read or write operations. The inventive concepts include fast test setup and initialization of the memory array. The data can be retention tested or otherwise verified using similar massive parallel testing techniques. Embodiments also include a memory test system including a memory device having DFT circuitry configured to perform massive parallel stress testing, retention testing, functional testing, and test setup and initialization.

26 Claims, 11 Drawing Sheets

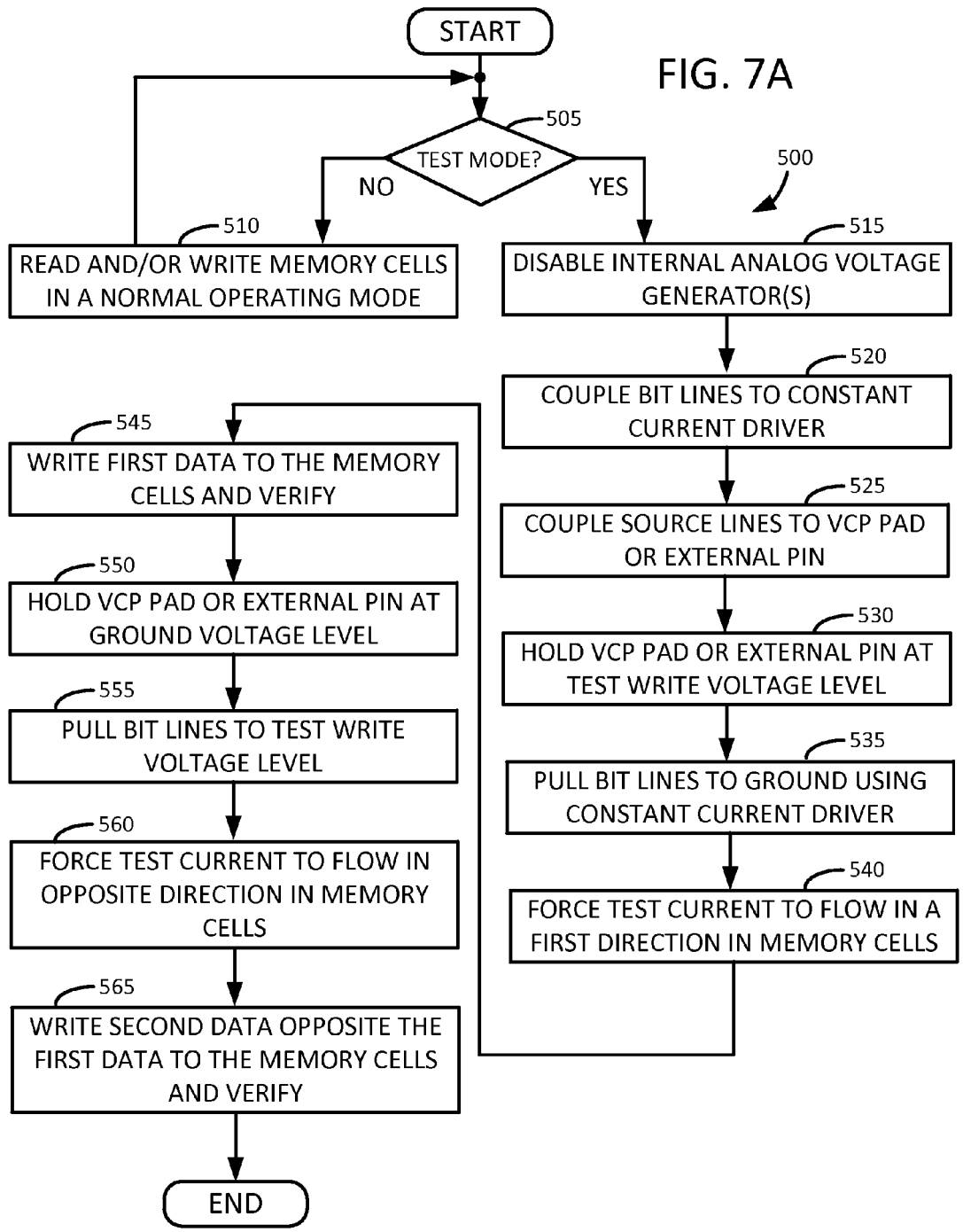

200
ARCHITECTURE, SYSTEM AND METHOD FOR TESTING RESISTIVE TYPE MEMORY

BACKGROUND

The present inventive concepts relate to testing resistive type memory circuits, and more particularly to stress testing, retention testing, functional testing, and fast test initialization, and for improving the reliability of memory circuits.

Resistive type memories encompass a new generation of non-volatile memory and are expected to become dominant event to the point of eventually replacing conventional non-volatile memories such as flash memory, Erasable Programmable Read Only Memory (EPROM), and the like. It is expected that resistive type memories might also eventually replace traditional volatile memories such as Dynamic Random Access Memory (DRAM), Static Random Access Memory (SRAM), and other similar volatile memory technologies.

The conventional non-volatile memory technologies can suffer from performance and long term reliability issues while the conventional volatile memory technologies suffer from the inability to permanently store data. On the other hand, resistive type memories have many of the most desirable features of flash and DRAM, without many of the drawbacks. Resistive type memories can include, for example, spin transfer torque (STT) magnetoresistive random-access memory (MRAM), MRAM (of the non-STT variety), phase change RAM, memristor RAM, ReRAM, CBRAM, and the like. By combining the permanent storage benefits of non-volatile memory with the high performance and reliability characteristics of DRAM or other volatile type memories, resistive type memories are positioned for an important role in the marketplace.

Prior to entering the field, memory circuits must be tested. Otherwise, memory cell infant mortality rates would be unacceptably high. Such failures can be disruptive to computer equipment, embedded devices, software algorithms, and so forth. As the size and density of memory circuits increases, the importance for effective, thorough and efficient testing proportionally increases.

Resistive type memory cells in their simplest form include a variable resistor and a transistor. Using a standard convention, a low resistance state is defined as being a logic '0', or low logic state, and a high resistance state is defined as being a logic '1', or high logic state. It will be understood that other conventions can be used, for example, where a low resistance state is defined as logic '1' and a high resistance state is defined as logic '0'.

Resistive type memory cells are designed to have a critical switching voltage or current. For example, when sufficient current is passed through the cell to satisfy the switching current level, then the cell will typically switch from one logic value to another. Switching cells from a high logic state to a low logic state, or from a low logic state to a high logic state, is probabilistic. In other words, there is a given probability that the switching voltage or current will change a memory cell from a '1' to a '0' or vice versa. In some cases, errors can occur when attempting to read or write a memory cell. For example, when reading a memory cell, sometimes the cell accidentally switches when it is not expected to switch. Read disturb of a memory cell occurs when the memory cell data changes unintentionally during a read operation. Read disturb tends to happen when the read error rate of a memory cell is unusually high. When writing a memory cell, sometimes the cell doesn't switch when it is expected to switch. Write errors occur when the write error rate of a memory cell is unusually high.

Some memory cells may exhibit a higher error rate than others. If the aggregate error rate of a memory device is too high, then the memory devices cannot go into production. Conventional testing methods, which may be effective for DRAM, flash, and other traditional memories, generally do not translate to resistive type memories, nor are they conducive to the unique physical characteristics of resistive memories such as STT-MRAM. Moreover, as the size and density of resistive type memories continues to increase, the difficulty and time expended for efficiently testing the resistive type memories also increases. It would be desirable to apply massive parallel screening to reduce test time and cost. It would also be desirable to provide techniques for retention testing, functional testing, fast initialization, and for improving the reliability of memory circuits.

BRIEF SUMMARY

According to one embodiment of the inventive concept, a method includes coupling bit lines of a plurality of resistive type memory cells to a constant current driver, and source lines of the memory cells to a common plane voltage (VCP) pad or external pin, holding the VCP pad or external pin at a test write voltage level for a period of time associated with a test write pulse width while the constant current driver pulls the bit lines to a ground voltage level, driving, in parallel, a first write test current to flow in a first direction through the memory cells to write first data to the memory cells, holding the VCP pad or external pin at the ground voltage level for the test write pulse width or time while the constant current driver pulls the bit lines to the test write voltage level, and driving, in parallel, a second write test current to flow in a second direction opposite to the first direction through the memory cells to write second data opposite to the first data to the memory cells.

According to another example embodiment, a memory device is provided that includes a plurality of resistive type memory cells, an internal analog voltage generator, a common plane voltage (VCP) pad or external pin, a switch configured to select either the internal analog voltage generator or the VCP pad or external pin to be coupled to source lines of the memory cells responsive to a first test control signal, a constant current driver, and a transistor associated with each of a plurality of bit lines, each transistor configured to couple each of the bit lines to the constant current driver responsive to a second test control signal.

According to yet another example embodiment, a memory device is provided that includes an array of resistive type memory cells and design for test (DFT) circuitry. The DFT circuitry can include a constant current driver configured to drive bit lines of the array of memory cells with a first test write current level in a first direction and a second test write current level in a second direction, and a write pulse width control circuit configured to provide a plurality of test control signals to the constant current driver.

The foregoing and other features and advantages of the invention will become more readily apparent from the following detailed description of the example embodiments, which proceeds with reference to the accompanying drawings.

BRIEF DESCRIPTION OF THE DRAWINGS

FIGS. 7A and 7B are flow diagrams showing techniques for massive parallel testing of memory cells, in accordance with some embodiments of the inventive concept.

DETAILED DESCRIPTION

Reference will now be made in detail to embodiments of the invention, examples of which are illustrated in the accompanying drawings. In the following detailed description, numerous specific details are set forth to enable a thorough understanding of the present invention. It should be understood, however, that persons having ordinary skill in the art may practice the present invention without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The components and features of the drawings are not necessarily drawn to scale.

Figure 1:
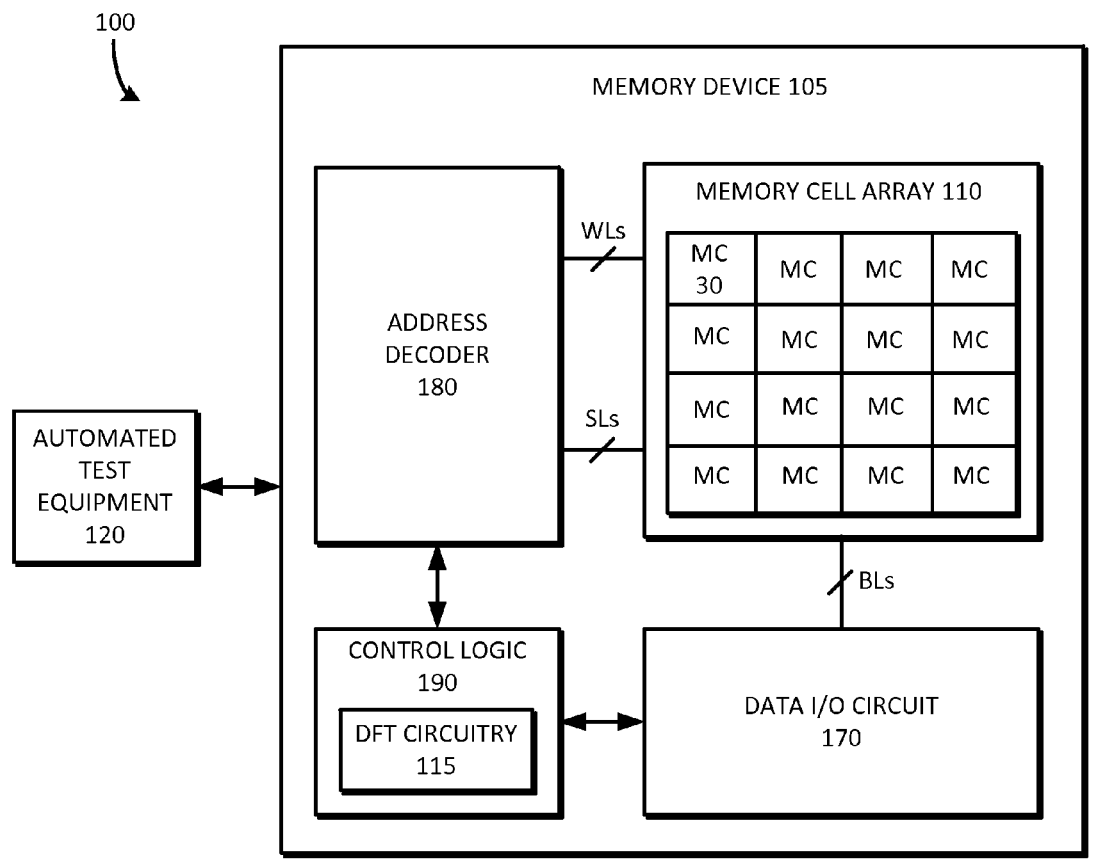
FIG. 1 is an example block diagram of a memory test system including a memory device having design for test (DFT) circuitry for testing memory cells of the memory array, in accordance with embodiments of the inventive concept.

FIG. 1 is an example block diagram of a memory test system 100 including a memory device 105 and automated test equipment 120. Referring to FIG. 1, the memory device 105 includes a memory cell array 110, a data I/O circuit 170, an address decoder 180, and a control logic 190. The control logic 190 may include design for test (DFT) circuitry 115 for testing memory cells of the memory cell array 110, in accordance with embodiments of the inventive concept.

Referring to FIG. 1, the memory cell array 110 may have a plurality of memory cells MC 30, each of which stores one or more data bits. The memory cells MC may be connected to a plurality of word lines WLs, a plurality of source lines SLs, and a plurality of bit lines BLs.

The address decoder 180 may be connected to the memory cell array 110 via the word lines WLs and source lines SLs. The address decoder 180 may operate responsive to the control of the control logic 190. The address decoder 180 may decode an input address to select the word lines WLs and source lines SLs. The address decoder 180 may receive power (e.g., a voltage or a current) from the control logic 190 to provide it to a selected or unselected word line.

The data input/output circuit 170 may be connected to the memory cell array 110 via the bit lines BLs. The data input/output circuit 170 may operate responsive to the control of the control logic 190. The data input/output circuit 170 may select a bit line in response to a bit line selection signal (not shown) from the address decoder 180. The data input/output circuit 170 may receive power (e.g., a voltage or a current) from the control logic 190 to provide it to a selected bit line.

The control logic 190 may be configured to control an overall operation of the memory device 105. The control logic 190 may be supplied with external power and/or control signals. The control logic 190 may generate power needed for an internal operation using the external power. The control logic 190 may control read, write, and/or erase operations in response to the control signals. The control logic 190 may comprise a design for test (DFT) circuitry 115 for testing memory cells of the memory cell array 110, in accordance with embodiments of the inventive concept.

Figure 2A:
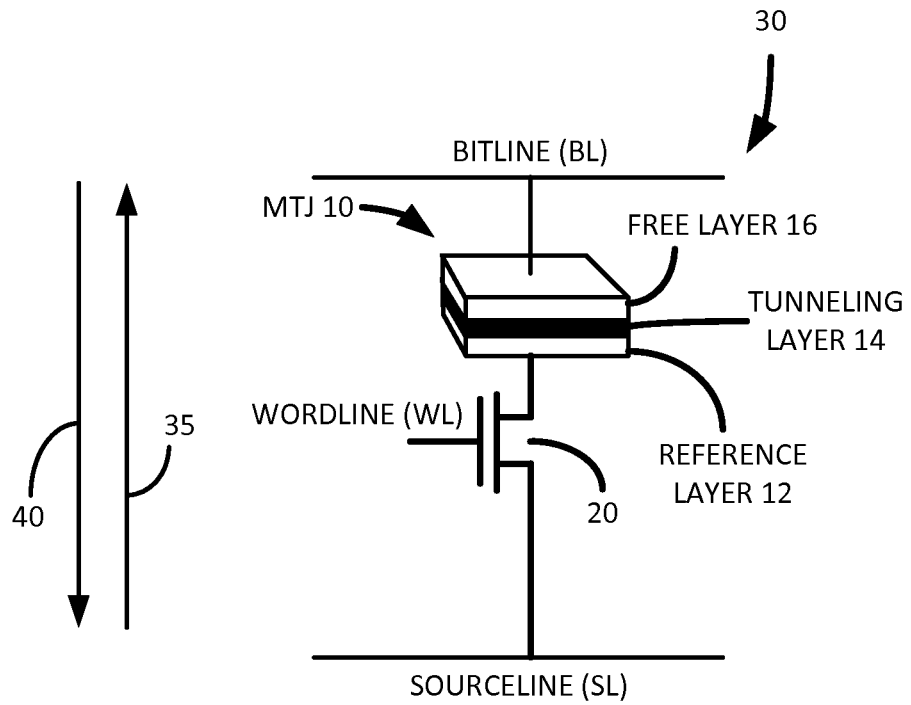
FIGS. 2A and 2B are schematic diagrams of an example STT-MRAM memory cell included in the memory array of the memory device of FIG. 1.
Figure 2B:
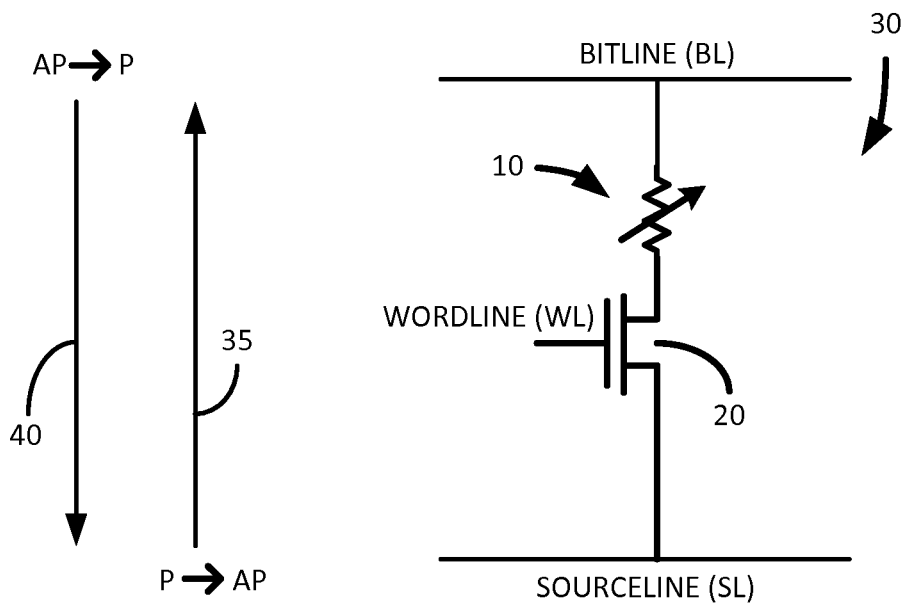
Figure 3A:
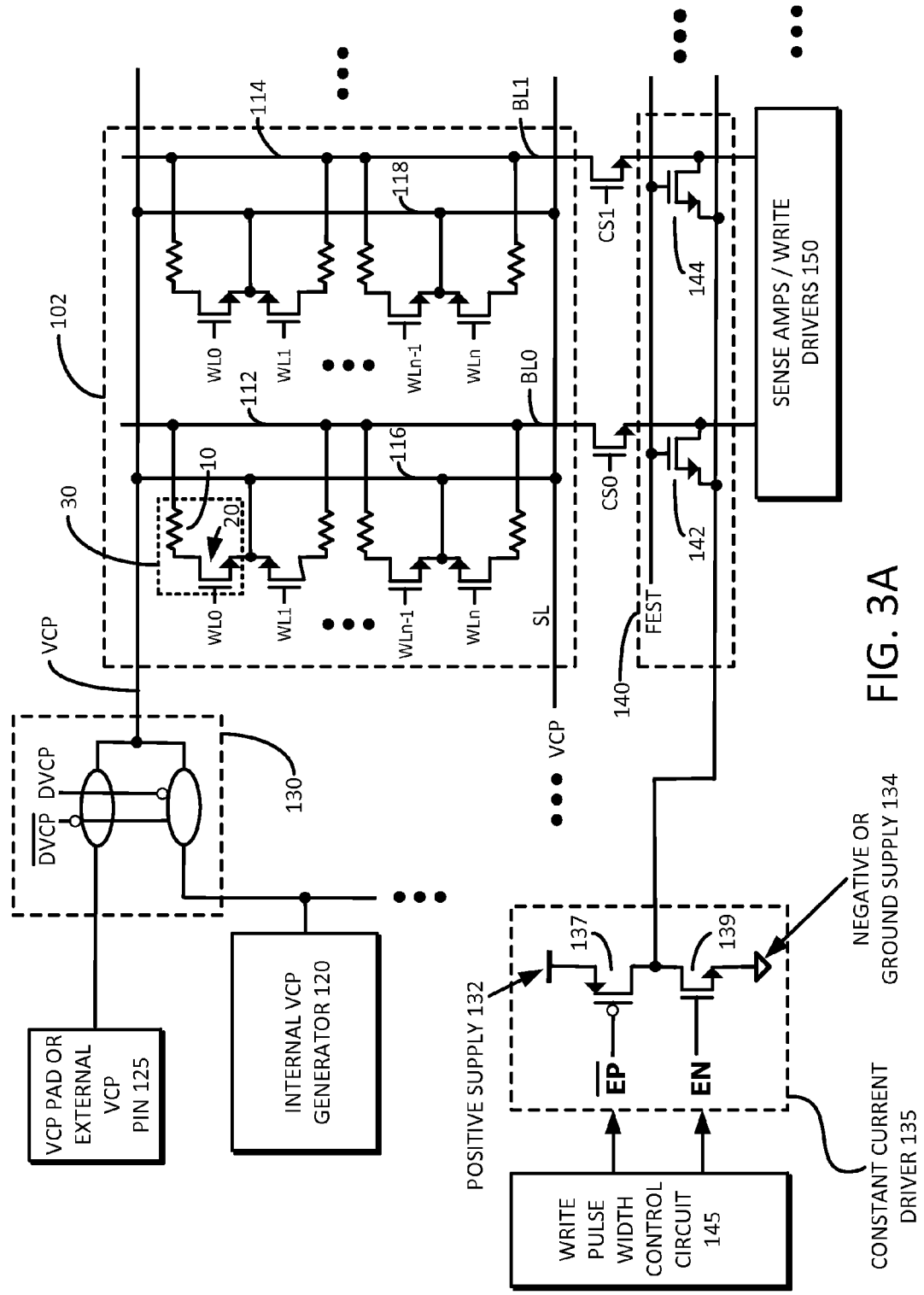
FIGS. 3A and 3B are example block diagrams of DFT circuitry of the memory device of FIG. 1, including fast error stress test circuitry, in accordance with some embodiments of the inventive concept.
Figure 3B:
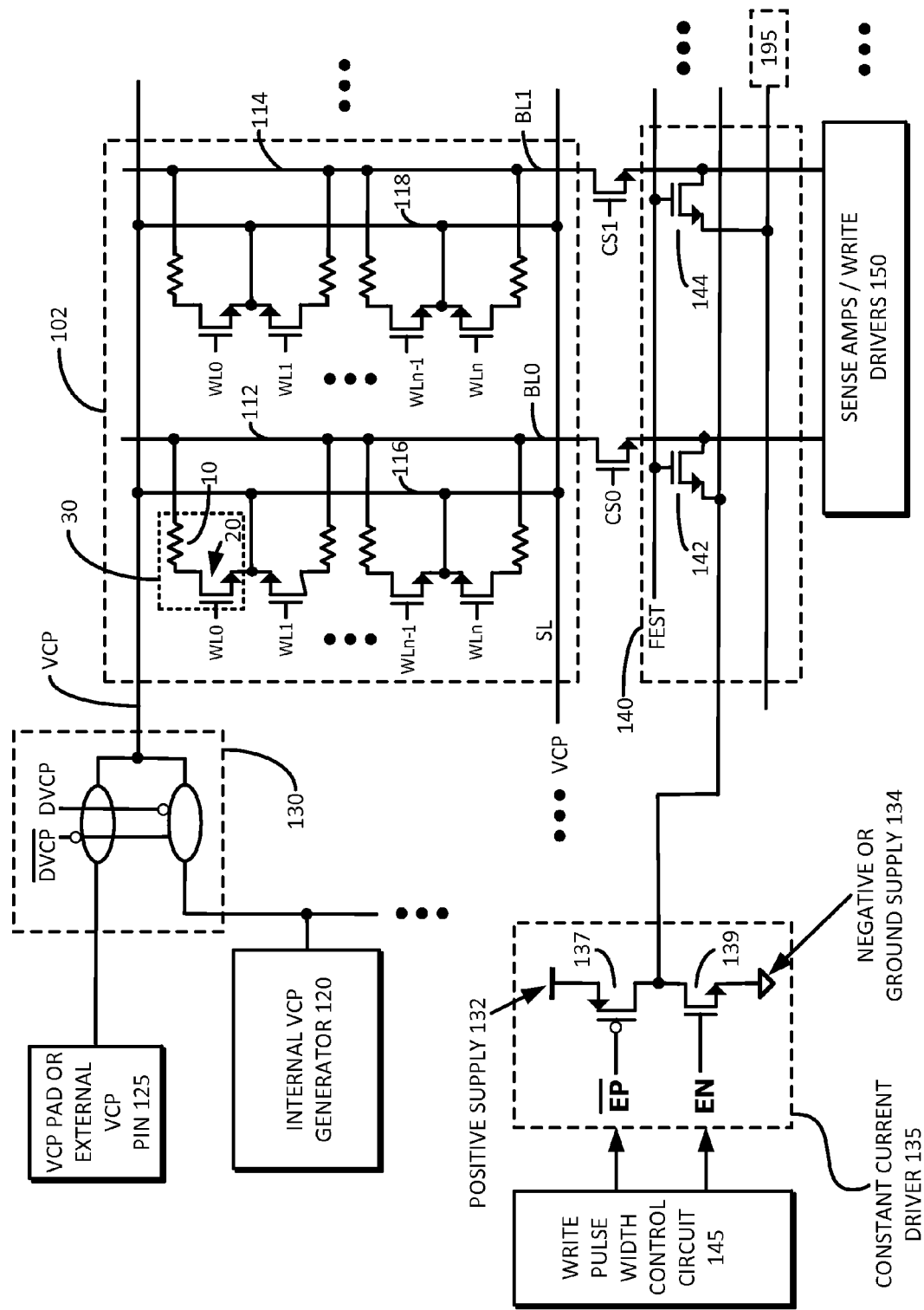

FIGS. 2A and 2B are a schematic diagram of an example STT-MRAM memory cell 30 included in the memory cell array 110 of the memory device 105 of FIG. 1. FIGS. 3A and 3B are example block diagrams of DFT circuitry 115 of the memory device 105 of FIG. 1, including fast error stress test circuitry, in accordance with some embodiments of the inventive concept. Reference is now made to FIGS. 1-3B.

Embodiments of the inventive concept disclosed herein can be used to screen out memory bits with high error rates and poor retention. As shown in FIG. 1, the memory device 105 can include, for example, a memory cell array 110 and DFT circuitry 115. The DFT circuitry 115 can be designed into memory core. Optionally, automated test equipment (ATE) 120 can be coupled to the memory device 105 to assist in testing the memory device 105. As mentioned above, in some embodiments, the DFT circuitry 115 is built-in to the memory device 105. In an alternative embodiment, the DFT circuitry 115 or portions of the DFT circuitry are located in the ATE 120 or other host-side system. Write test currents can be driven through multiple memory cells simultaneously, then verified, and then write test currents can be driven in the opposite direction through the multiple memory cells simultaneously, and then verified. The ability to massively write in parallel to multiple memory cells provides easy and efficient test initialization. In other words, the same data can be written on a massive scale in parallel to one or more selected blocks, or alternatively, to all memory blocks (e.g., multiple memory cells of an entire memory device) depending on memory density, as further described in detail below. Moreover, read disturb test currents can be driven through the multiple memory cells simultaneously, in either direction, and then verified. In addition, cell-to-cell influence and retention errors can also be screened.

In some embodiments, the memory cell array 110 includes a plurality of spin transfer torque (STT) magnetoresistive random-access memory (MRAM) memory cells. It will be understood, however, that inventive concepts described herein apply to resistive memories of other types, such as MRAM (of the non-STT variety), phase change RAM, memristor RAM, ReRAM, CBRAM, and the like.

FIG. 2A shows a magnetic tunnel junction (MTJ) 10, which forms a variable resistor in an STT-MRAM type memory cell, and an associated select transistor 20, together forming an STT-MRAM cell 30. The MTJ 10 includes a reference or pinned layer 12, a free layer 16, and a tunneling layer 14 disposed between the reference layer 12 and the free layer 16. Transistor 20 is often an NMOS transistor due to its inherently higher current drive, lower threshold voltage, and smaller area relative to a PMOS transistor. The current used to write a "1" in MRAM 30 can be different than the current used to write a "0". The asymmetry in the direction of current flow during these two write conditions is caused by the asymmetry in the gate-to-source voltage of transistor 20.

In the following description, an MRAM cell is defined as being in a logic "0" state when the free and reference layers of its associated MTJ are in a parallel (P) state, i.e., the MTJ exhibits a low resistance. Conversely, an MRAM cell is defined as being in a logic "1" state when the free and reference layers of its associated MTJ are in an anti-parallel (AP) state, i.e., the MTJ exhibits a high resistance. It will be understood that in other embodiments, the MRAM cell can be defined as being in the logic "0" state when in an AP state, and the logic "1" state when in a P state. Furthermore, in the following, it is assumed that the reference layer of the MTJ 10 faces its associated select transistor, as shown in FIG. 2A.

Therefore, in accordance with the discussion above, a current flowing along the direction of arrow 35 (i.e., the up direction) either (i) causes a switch from the P state to the AP state thus to write a "1", or (ii) stabilizes the previously established AP state of the associated MTJ. Likewise, a current flowing along the direction of arrow 40 (i.e., the down direction) either (i) causes a switch from the AP state to the P state thus to write a "0", or (ii) stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 either (i) causes a switch from the AP state to the P, or (ii) stabilizes the previously established P state of the associated MTJ. Likewise, in such embodiments, a current flowing along the direction of arrow 40 either (i) causes a switch from the P state to the AP state, or (ii) stabilizes the previously established AP state.

FIG. 2B is a schematic representation of MRAM 30 of FIG. 2A in which MTJ 10 is shown as a storage element whose resistance varies depending on the data stored therein. The MTJ 10 changes its state (i) from P to AP when the current flows along arrow 35, and/or (ii) from AP to P when the current flows along arrow 40.

The voltage required to switch the MTJ 10 from an AP state to a P state, or vice versa, must exceed the critical switching voltage, $V_{c0}$. The current corresponding to this voltage is referred to as the critical or switching current $I_{c0}$. While the specified critical value $V_{c0}$ and related critical switching current $I_{c0}$ can be defined in various ways, such values can be selected based on a 50% switching probability of the memory cell within a specified time. In other words, the critical switching current $I_{c0}$ can be selected or otherwise determined based on the design of the MTJ 10 and/or based on measurements of the probability of switching at a particular critical value $V_{c0}$ and/or switching current $I_{c0}$. When the threshold critical switching current $I_{c0}$ is satisfied, there can be a 50% chance that the stored memory bit switches values (e.g., from a "0" to a "1" or a "1" to a "0"). An overdrive current is applied to guarantee that switching occurs at an error rate that is acceptable to meet standard reliability expectations. This overdrive current, or switching current, $I_{sw}$, may be 1.3 times, 1.5 times, 2 times, or more than 2 times the value of $I_{c0}$. For example, if the $I_{c0}$ for an MTJ device is 7 microamps (uA) at a 20 nanosecond (ns) write pulse width, then the $I_s$, used to reliably switch the states of the MTJ may be 11 uA or greater.

In some cases, the "safe" write current (e.g., where the write error rate is less than about 10e-9) may be 1.5 to 2 times the critical switching current $I_{c0}$ for a certain period of time, for example, 10 nanoseconds. To read the bit value back out of the memory cell, a relatively "safe" read current can be applied (e.g., where the read error rate is less than about 10e-9). For example, the "safe" read current may be 0.2 times (i.e., 20%) of the critical switching current $I_{c0}$. By way of another example, if the critical switching current $I_{c0}$ is 6 microamps (uA), then the write current under a normal operation mode can be at least 12 uA, or thereabout, and the read current under a normal operating mode can be less than 1.2 uA, or thereabout. In this manner, the probability of the memory cell properly switching under a normal write condition is very high, in some cases near 100%. Similarly, the probability of accidentally switching the value of the memory cell under a normal read condition can be very low, in some cases near zero.

Once in the AP state, removing the applied voltage does not affect the state of the MTJ 10. Likewise, to transition from the AP state to the P state under the normal operating mode, a negative voltage of at least $V_{c0}$ is applied so that a current level of at least the switching current $I_{c0}$ flows through the memory cell in the opposite direction. Once in the P state, removing the applied voltage does not affect the state of the MTJ 10.

In other words, MTJ 10 can be switched from an anti-parallel state (i.e., high resistance state, or logic "1" state) to a parallel state so as to store a "0" (i.e., low resistance state, or logic "0" state). Assuming that MTJ 10 is initially in a logic "1" or AP state, to store a "0", under the normal operating mode, a current at least as great or greater than the critical current $I_{c0}$ is caused to flow through transistor 20 in the direction of arrow 40. To achieve this, the source node (SL or source line) of transistor 20 is coupled to the ground potential via a resistive path (not shown), a positive voltage is applied to the gate node (WL or wordline) of transistor 20, and a positive voltage is applied to the drain node (BL or bitline) of transistor 20.

As mentioned above, MTJ 10 can also be switched from a parallel state to an anti-parallel state so as to store a "1". Assuming that MTJ 10 is initially in a logic "0" or P state, to store a "1", under the normal operating mode, a current at least as great or greater than the critical current $I_{c0}$ is caused to flow through transistor 20 in the direction of arrow 35. To achieve this, node SL is supplied with a positive voltage via a resistive path (not shown), node WL is supplied with a positive voltage, and node BL is coupled to the ground potential via a resistive path (not shown).

FIG. 3A is a block diagram showing a portion or block 102 of the memory array 110 of FIG. 1. The block 102 includes memory cells, for example, such as STT-MRAM cell 30. As discussed above with reference to FIGS. 2A and 2B, the free layer 16 of each of the STT-MRAM cells can be coupled to bit lines BL0 and BL1 such as 112 and 114. The reference layer 12 of each of the STT-MRAM cells 30 can be coupled to a drain of its associated select transistor 20. The source of each of the select transistors 20 can be coupled to source lines, such as lines 116 and 118. The source lines (e.g., 116 and 118) are coupled to either an internal analog voltage generator such as the internal common voltage plane (VCP) generator 120 under the normal operating mode, or to a VCP pad or external VCP pin 125 under a test mode, as further described below. The gates of the select transistors are controlled by word lines (e.g., WL0, WL1, WLn−1, through WLn).

The DFT circuitry 115 (of FIG. 1) includes, for example, one or more constant current drivers 135, fast error stress test (FEST) circuitry 140, one or more VCP select switches 130, the VCP pad or external VCP pin 125, and optionally one or more write pulse width control circuits 145.

The VCP select switch 130 can select between either the internal VCP generator 120 or the VCP pad or external pin 125. In other words, the source lines (e.g., 116 and 118) can be coupled to either the internal VCP generator 120 or the VCP pad or external pin 125 responsive to a test control signal DVCP and/or DVCP\. For example, when the DVCP signal is asserted, the internal VCP generator 120 can be disabled or otherwise disconnected from the source lines of the memory cell array 110, and the VCP pad or external pin 125 can be enabled or otherwise connected to the source lines of the memory cell array 110. Conversely, when the DVCP signal is not asserted, the internal VCP generator 120 can be enabled or otherwise connected to the source lines of the memory cell array 110, and the VCP pad or external pin 125 can be disabled or otherwise disconnected from the source lines of the memory cell array 110. The VCP select switch 130 can be a multiplexer or other suitable switch.

The constant current driver 135 can include, for example, a p-channel type transistor 137 coupled to a positive voltage supply 132 and an n-channel type transistor 139 coupled to a negative or ground voltage supply 134. The transistor 137 may be coupled to a PMOS current minor circuit (not shown). Similarly, the transistor 139 may be coupled to an NMOS current minor circuit (not shown). The transistors are controlled by test control signals EP\ and EN. The EP\ and EN test control signals can optionally be generated internal to the memory device using one or more write pulse width control circuits 145, as further described below. In some embodiments, the EP\ and EN signals can be generated external to the memory device 105 and provided to the constant current driver 135. Under the normal operating mode, the constant current driver 135 may be tri-stated to remove its influence on the rest of the memory device 105 when it is not being tested.

The FEST circuitry 140 includes FEST transistors 142 and 144 associated with each of the bit lines 112 and 114, respectively. It will be understood that each bit line can have an associated FEST transistor coupled thereto. Each FEST transistor can couple each of the bit lines BL0 and BL1, respectively, to the constant current driver 135 responsive to a FEST test control signal. Column select signals CS0, CS1, and the like, control the selection of columns of the memory cell array 110. The FEST transistors 142 and 144 can bypass the sense amplifiers/write drivers 150 during a test mode responsive to the FEST test control signal.

The DVCP, DVCP\, and/or FEST test control signals are used to enter a fast error stress test mode. The FEST test control signal causes the bit lines to be connected to the constant current driver 135. The DVCP and/or DVCP\ signals cause the source lines to be connected to the VCP pad or external pin 125.

I. Write Error Rate (WER) Screening

When screening for write errors under the test mode, the VCP pad or external pin 125 can be held at a positive test write voltage level for a first write pulse width or time while the constant current driver 135 can pull the bit lines to a ground voltage level. The n-channel transistor 139 of the constant current driver 135 can be enabled by the EN signal while the p-channel transistor 137 is disabled by the EP\ signal.

In this phase of the test, the VCP pad or external pin 125 and the constant current driver 135 can inject or drive a first test current to flow in a first direction (e.g., from the source lines through the select transistor 20 and then through the MTJ 10 in the direction of arrow 35) through the memory cells. Thus, first data (e.g., all "1" or all "0") is written to the memory cells. Such a stress test operation can be performed on a massive parallel scale. In some embodiments, all or substantially all memory cells in the memory device 105 (of FIG. 1) can be tested in this fashion simultaneously (i.e., in parallel). In some embodiments, all or substantially all memory cells of a memory block that includes, for example, at least 1K (i.e., 1024) memory cells can be tested in this fashion simultaneously (i.e., in parallel) such that the total current is within a manageable level. For example, at least 1024 word lines associated with at least 1024 memory cells in a particular column can be simultaneously turned on. By way of another example, a single word line can be turned on, and multiple columns (e.g., 1024 columns) can be simultaneously turned on, thereby testing at least 1024 memory cells in parallel.

After simultaneously writing, i.e., in parallel, the first data to the memory cells on a massive scale, the data can be read back for verification purposes. In other words, verifying after a massive parallel write operation includes checking for memory cells that did not flip as they were expected. For example, a standard read operation using sense amplifiers 150 and other memory read circuitry can be performed to verify that the first data was properly written to each of the memory cells. By way of another example, a verification circuit (not shown) can be used to verify whether the first data was successfully written to each of the memory cells. In addition, address and data compression circuitry can be used, to reduce read time for the same data stored in the memory cells. Given that the same data is written to the memory cells, verifying the data in a read compression mode can be useful and efficient, which allows for faster verification. In addition, when not using address and data compression, the failed bits or memory cells can be recorded or otherwise replaced by one or more redundant memory cells.

After writing the first data to the memory cells and performing the verification procedure, opposite data can be written to the memory cells, on a similar massive scale. The VCP pad or external pin 125 can be held at the ground voltage level for a second write pulse width or time while the constant current driver 135 pulls the bit lines to the test write voltage level. The n-channel transistor 139 of the constant current driver 135 can be disabled by the EN signal while the p-channel transistor 137 is enabled by the EP\ signal.

In this phase of the test, the VCP pad or external pin 125 and the constant current driver 135 can inject or drive a second test current to flow in a second direction (e.g., from the bit lines through the MTJ 10 and then through the select transistor 20 in the direction of arrow 40) opposite to the first direction 35 through the memory cells. Thus, second data (e.g., all "0" or all "1") is written to the memory cells. Such a stress test operation can be performed on a massive parallel scale. In some embodiments, all or substantially all memory cells in the memory device 105 (of FIG. 1) can be tested in this fashion simultaneously (i.e., in parallel). In some embodiments, all or substantially all memory cells of a memory block that includes, for example, at least 1K (i.e., 1024) memory cells can be tested in this fashion simultaneously (i.e., parallel). The second write test current can be different from or substantially the same as the first write test current.

Write currents having larger amplitudes, longer periods (i.e., pulse widths), and/or tested under higher temperature environments, increase the switching probability. Conversely, write currents having smaller amplitudes, shorter periods, and/or tested under lower temperature environments, decrease the switching probability, thereby making it harder to successfully write the data. Thus, to check write error rates, the write current amplitude, pulse width, and/or testing temperature can be reduced such that the switching probability is reduced, thereby purposely increasing the write error rate, as explained in further detail below.

After simultaneously writing the second data to the memory cells on a massive scale, the data can be read back for verification purposes. For example, a standard read operation using sense amplifiers and other memory read circuitry can be performed to verify that the second data was properly written to the memory cells. As mentioned above, a verification circuit can be used to verify whether the first data was successfully written to the memory cells. In addition, address and data compression circuitry can be used to reduce read time for the same data stored in the memory cells. Given that the same data is written to the memory cells, verifying the data in a read compression mode can be useful and efficient, which allows for faster verification.

II. Read Error Rate (RER) Screening, Fast Test Initialization, and Retention Testing In addition to or alternative to write stress testing the memory cells, as discussed above, the memory cells can also be screened for read errors. For example, RER screening can include testing for read disturb on a massive scale, as further explained below. In addition, fast test initialization and retention-testing can be performed on a similar massive scale.

Prior to read disturb or retention testing, the massive parallel writing techniques discussed above can be used to quickly and efficiently initialize an entire memory array or one or more blocks of the memory array to a given data value. In other words, the VCP pad or external pin and the constant current driver can drive, in parallel, an initialization current through the memory cells so that either first data (e.g., all "1s") or second data (e.g., all "0s") are written to the memory cells. In an alternative embodiment, an external magnetic field (not shown) can be used to induce currents within the memory cells and cause data to be written to the memory cells, thereby preparing for a read disturb or retention type test. Alternatively, the memory cells can be initialized using standard memory write procedures, although such an approach results in longer test setup times.

After one or more memory blocks are initialized to a known data value, a read disturb test current can be injected or driven, in parallel, through the memory cells on a massive scale. The read disturb current can be driven, in parallel, to flow in the first or second direction through the memory cells. For example, the read disturb current can be driven from the VCP pad or external pin, through the memory cells, and to the constant current driver. Alternatively, the read disturb current can be driven from the constant current driver, through the memory cells, and to the VCP pad or external pin. The read disturb current is higher than a normal read current, as further explained below, which increases the probability that the data bit value in one or more of the memory cells will flip during testing.

More specifically, RER screening can include injecting or driving the read disturb current through the memory cells by holding the VCP pad or external pin at a test read voltage level for a period of time associated with the test read pulse width while the constant current driver pulls the bit lines to the ground voltage level. Alternatively, RER screening can include injecting or driving the read disturb current through the memory cells by holding the VCP pad or external pin at the ground voltage level for a test read pulse width or time while the constant current driver pulls the bit lines to the test read voltage level. The test read pulse width or time can be longer than a normal read pulse width or time, as further explained below, which also purposely increases the probability that bit value will flip during testing.

After driving, in parallel, the read disturb test current through the memory cells on a massive scale, the data stored in the memory cells can be read back for verification purposes. For example, a standard read operation can be performed using a normal read current, the sense amplifiers 150, and other memory read circuitry, to verify whether the data values as originally initialized flipped or did not flip. By way of another example, the data can be read and verified in a read compression mode using compression circuitry. In addition, when not using address and data compression, the failed bits or memory cells can be recorded or otherwise replaced by one or more redundant memory cells.

The read disturb current can be applied on a massive scale similar to the writes, although an even greater number of memory cells can be simultaneously tested when driving the read disturb current because the read currents are less than the write currents. In addition, retention failures can be screened by writing in parallel (i.e., initializing) data to the memory cells, reading in parallel the memory cells at a stress voltage or current, and then testing for retention of the correct bit values.

III. Variations in WER Screening and RER Screening

In general, higher currents, longer periods (i.e., pulse widths), and higher temperature increase the switching probability. To check write error rates, the write current, period, and/or test environment temperature can be reduced such that the switching probability is reduced, thereby purposely increasing the write error rate. To check read error rates, the current, period, and/or test environment temperature can be increased to increase the switching probability, thereby purposely increasing the read error rate.

During the phases of the test involving massive parallel writes (in either direction), a write current having an amplitude that is lower than the normal or "safe" write current can be used to reduce the probability of causing the memory cell value to switch such that the weaker bits may be screened during the test mode and replaced by one or more redundant memory cells. The probability of switching is reduced because it becomes harder to cause the MTJ 10 to switch from a parallel state to an anti-parallel state, or from an anti-parallel state to a parallel state at lower currents. For example, the first and/or second write test currents can be X % of a normal write current, where X is less than 100. In other words, the amplitude of the write currents can be reduced during the test mode such that the test write current is X % of the normal write current. X can be determined based on simulations, modeling, or other experimental measurements. For example, X can be 95, 90, 85, 80, 75, 70, 65, 60, 55, 50 and so forth, depending on the desired level of stress.

In addition to the amplitude adjustment of the write current, the write pulse width or time can also be adjusted during the test mode. A write pulse width that is shorter than a normal write pulse width increases the write error rate. The write test current and/or write pulse width may be reduced from the normal values to purposely increase the write error rate such that the weaker bits may be screened and/or repaired. For example, if the normal write pulse width is 20 ns, then the write pulse width under the test mode can be 10 ns or thereabout. A combination of amplitude reduction and pulse width reduction can be used. In addition, the temperature of the test environment can be decreased relative to a normal operating temperature range so that it makes it more difficult for the MTJ 10 to switch. For example, the test environment temperature can be lowered to negative 20 degrees Celsius or thereabout, negative 40 degrees Celsius or thereabout, and so forth, which are lower than the normal operating temperature range. A burn-in oven or other temperature cycling appliance or ATE can be used to adjust the test environment temperature. The combination of lower write voltage and current, shorter write pulse widths, and/or lower temperature, while performing massively parallel writes, can be used to reduce test time.

During the phases of the test involving massive parallel reads, a read current having an amplitude that is higher than the normal or "safe" read current can be used to increase the probability of read disturb such that the weaker bit may be screened during the test mode and replaced by one or more redundant memory cells accordingly. The probability of read disturb is increased because the MTJ 10 is more likely to switch from a parallel state to an anti-parallel state, or from an anti-parallel state to a parallel state at higher currents. For example, the first and/or second read test currents can be X % of a normal read current, where X is greater than 100. In other words, the amplitude of the read currents can be increased during the test mode such that the test read current is X % of the normal read current, where X is greater than 100. X can be determined based on simulations, modeling, or other experimental measurements. For example, X can be 105, 110, 115, 120, 125, 130, 135, 140, 145, 150, and so forth, depending on the desired level of stress.

In addition to the amplitude adjustment of the read current, the read pulse width can also be adjusted during the test mode. A read pulse width that is longer than a normal read pulse width increases the read error rate. The read test current and/or read pulse width may be increased from the normal values to purposely increase the read error rate such that the weaker bits may be screened and/or repaired. For example, if the normal read pulse width is 10 ns, then the read pulse width under the test mode can be 20 ns or thereabout. A combination of amplitude increase and pulse width increase can be used. In addition, the temperature of the test environment can be increased relative to a normal operating temperature so that it makes it easier for the MTJ 10 to accidentally switch. For example, the test environment temperature can be increased to 125 degrees Celsius or thereabout, 150 degrees Celsius or thereabout, and so forth, which are higher than the normal operating temperature range. A burn-in oven or other temperature cycling appliance or ATE can be used to adjust the test environment temperature, for example, up to 260 degrees Celsius or more. The combination of higher read voltage and current, longer read pulse widths, and/or higher temperature, while performing massively parallel reads can be used to reduce test time.

The massive parallel writing techniques discussed above can be used to quickly and efficiently initialize an entire memory array or one or more blocks of the memory array to a given data value. In other words, the inventive concepts disclosed herein provide fast test setup features so that the data can then be retention tested or otherwise read and verified for accuracy. In an alternative embodiment, an external magnetic field (not shown) can be used to induce currents within the memory cells and cause data to be written to the memory cells.

IV. Functional Tests and Cell-To-Cell Influence Screening

Embodiments of the inventive concept can be used to perform functional tests of resistive type memory cells. In addition, cell-to-cell influence can be checked as part of such functional tests. For example, address and data patterns such as a checkerboard pattern, a moving inversion pattern, a row stripe, and/or a column stripe pattern can be generated and tested in different functional test modes. In some embodiments, all columns are enabled and a single row or word line is enabled, thereby functionally testing all memory cells within the row. In some embodiments, all rows or word lines are enabled and a single column is enabled, thereby functionally testing all memory cells within the column.

By way of another example, first data (e.g., "1s") can be written to even rows and second data (e.g., "0s") to odd rows. By way of yet another example, first data (e.g., "1s") can be written to even columns and second data (e.g., "0s") to odd columns. By way of still another example, a single, double, or multiple row stripe patterns can be written to the memory cells of one or more memory blocks. By way of yet another example, a single, double, or multiple column stripe patterns can be written to the memory cells of one or more memory blocks. A checker board pattern can be generated by selecting every other row and every other column, and writing first data (e.g., "1s"), then selecting alternate every other row and alternate every other column, and writing second data (e.g., "0s"). Mode Register Set (MRS) commands can be used to select one or more of the functional test modes, or other test modes discussed above.

Cell-to-cell influence can be checked or otherwise measured by reading the data back for verification purposes after the functional testing has occurred. In other words, after performing one or more functional tests, the data can be read back using a standard read operation to verify that the data was written properly or otherwise maintained its proper value. Electromagnetic interference originating from either a source external to the memory device or from neighbor memory cells, can impact the consistency of data quality and retention of data. By performing functional tests as set forth herein, weak bits or memory cells are screened by intentionally accelerating failures due to cell-to-cell influence or other disturbances.

FIG. 3B is a block diagram showing a portion or block 102 of the memory array 110 of FIG. 1. FIG. 3B is similar to the diagram of FIG. 3A, with the primary difference being that source of the FEST transistor 144 is coupled to a second constant current driver 195, which is a different constant current driver from the first constant current driver 135, or in other words, the constant current driver 195 is in addition to the constant current driver 135. The components of the constant current driver 195 are similar or identical to the components of the constant current driver 135. This embodiment allows for independent current drivers for odd and even columns. In other words, odd and even bit lines can be stressed with opposite current by enabling 135 and 195, and floating or otherwise disconnecting VCP. If the PMOS transistor of the constant current driver 135 is on and the NMOS transistor of the constant current driver 195 is on, then current will flow from 135 to 195, passing through and stressing the odd and even columns of memory cells with opposite current.

In other words, current will simultaneously flow in a first direction through memory cells associated with odd bit lines and in a second direction that is opposite to the first direction through memory cells associated with even bit lines. Opposite current will flow (i.e., the first and second directions are swapped relative to the different columns of memory cells) if the PMOS transistor of the constant current driver 195 is on and the NMOS transistor of the constant current driver 135 is on, while floating or otherwise disconnecting VCP. In addition, the output line of the constant current drivers 135 and/or 195 can be directly connected to a bonding pad for direct control via an external tester or ATE.

In other words, the even columns or bit lines can be coupled to the first constant current driver 135 and the odd columns or bit lines can be coupled to the second constant current driver 195. Thus, different columns can be stressed or functional tested in different directions simultaneously. Cell-to-cell stress can be measured or observed, for example, thereby screening for tunneling or other interference between cells of different columns.

Figure 4:
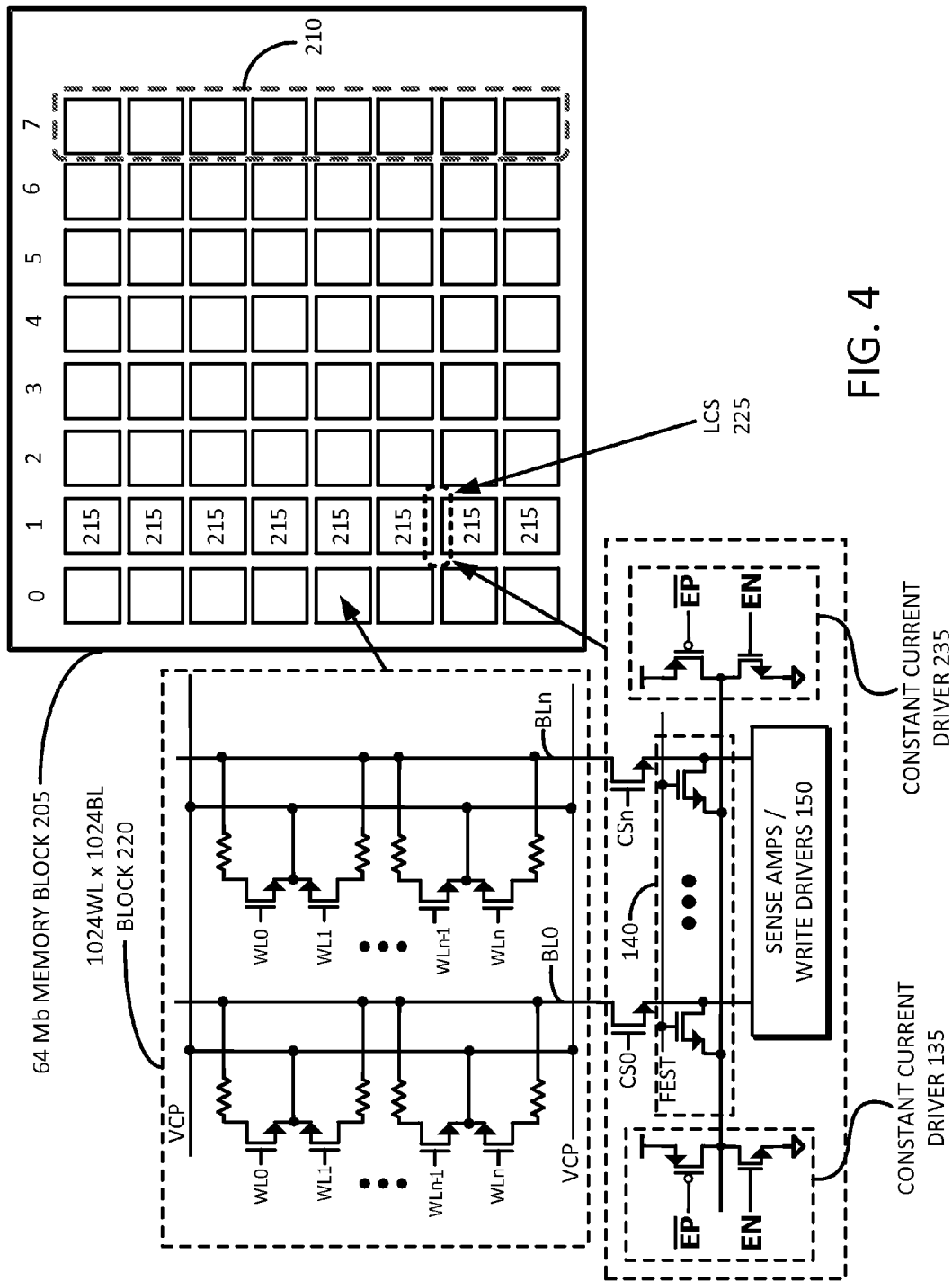
FIG. 4 is an example block diagram of a memory block and sub-blocks, in accordance with one embodiment of the inventive concept.

FIG. 4 is an example block diagram of a 64 Mb memory block 205, which includes sub-array blocks such as sub-array block 210. Each sub-array block 210 includes multiple memory array tiles (MATs) such as MATs 215. Each MAT 215 can include an array or block of memory cells. For example, each MAT 215 can include a memory block having M word lines (WL) and N bit lines (BL) such as the memory block 220. The number of word lines M can be any number from 1 to 1024, or in some embodiments, greater than 1024. Similarly, the number of bit lines N can be any number from 1 to 1024, or in some embodiments, greater than 1024. Each MAT 215 can have associated therewith a first constant current driver 135 and/or a second constant current driver 235, which can be included in a local column select (LCS) section 225 interposed between two MATs 215. The constant current drivers 135 and 235 are distributed so that sufficient drive is provided to the memory cells during the various test modes described herein. In some embodiments, one or both of the constant current drivers 135 and 235 are coupled to a pad or external pin, and can receive one or more of the test control signals (e.g., EP\ and EN) through the pad or external pin. In some embodiments, both of the constant current drivers 135 and 235 are coupled to the same pad or external pin. The LCS section 225 can also include the FEST circuitry 140. In some embodiments, the LCS section 225 can be replicated throughout the 64 Mb memory block 205, for example, between the various MATs 215. Any number of 64 Mb memory blocks 205 can be combined to form a larger memory cell array and/or device of any suitable size. The sense amplifiers/write drivers 150 can be local sense amplifiers/write drivers, and therefore interposed between the various MATs 215. Alternatively, one or more global sense amplifiers/write drivers (not shown) can be spaced apart from the MATs 215, and not included in the LCS 225.

Figure 5:
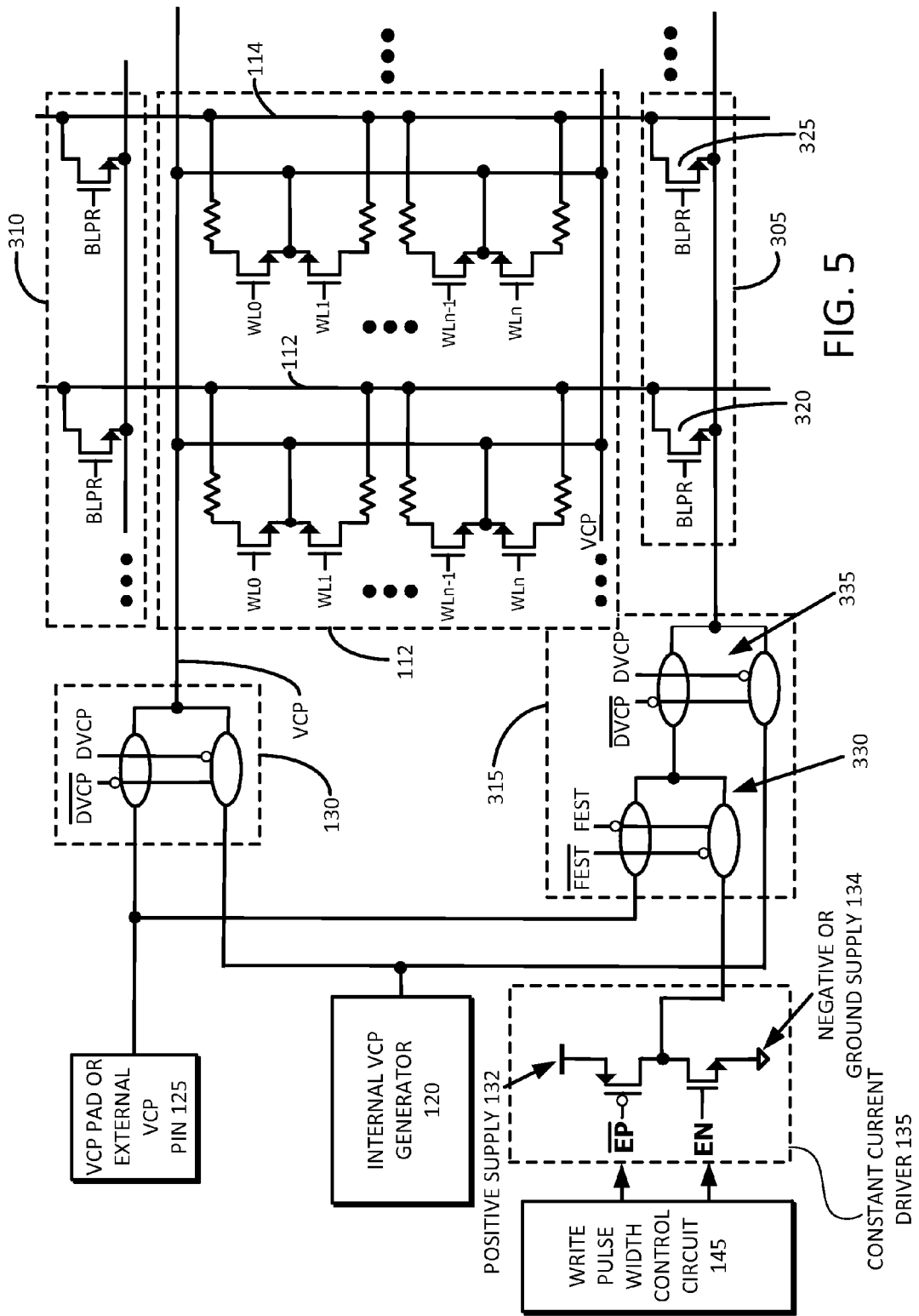
FIG. 5 is an example block diagram of DFT circuitry of the memory device of FIG. 1, including fast error stress test circuitry, in accordance with another embodiment of the inventive concept.

FIG. 5 is an example block diagram of DFT circuitry of the memory device of FIG. 1, including fast error stress test circuitry, in accordance with another embodiment of the inventive concept. Many of the components of FIG. 5 are similar to or the same as those of FIG. 3, and therefore, a detailed description of such components is omitted for the sake of brevity.

Rather than using FEST transistors to couple the bit lines (e.g., 112 and 114) to the constant current driver 135, bit line precharge transistors (BLPR) 320 and 325 are used. Since the BLPR transistors are usually already existent in memory devices, fewer parts are needed and less die space is required to implement the inventive concepts disclosed herein. Additional BLPR transistors 310 can also be used, which are disposed on an opposite end of the block 112. Moreover, the BLPR transistors can be designed to have larger physical characteristics or otherwise boosted to provide sufficient drive. A switch circuit 315 includes a FEST switch 330 and a DVCP switch 335. The DVCP switch 335 operates in a similar fashion as that of VCP select switch 130, although in this case, it operates in conjunction with the FEST switch 330. For example, when the DVCP signal and the FEST signal are asserted, the internal VCP generator 120 can be disabled or otherwise disconnected from the sources of the BLPR transistors (e.g., 320 and 325), and the constant current driver 135 is connected to the sources of the BLPR transistors, and therefore, to the bit lines (e.g., 112 and 114) when the BLPR transistors are turned on. Conversely, when the DVCP signal is not asserted, the internal VCP generator 120 can be enabled or otherwise connected to the sources of the BLPR transistors, and therefore, to the bit lines when the BLPR transistors are turned on. It will be understood that the BLPR transistors (e.g., 305 and/or 310) can be coupled to the constant current driver 135 or to another constant current driver using a similar switch (not shown) to that of switch 315. Thus, the memory cells of an entire memory array, or a block of memory cells, can be tested simultaneously, as set forth in detail above, without the need of designing the FEST transistors for each column into the memory device.

Figure 6:
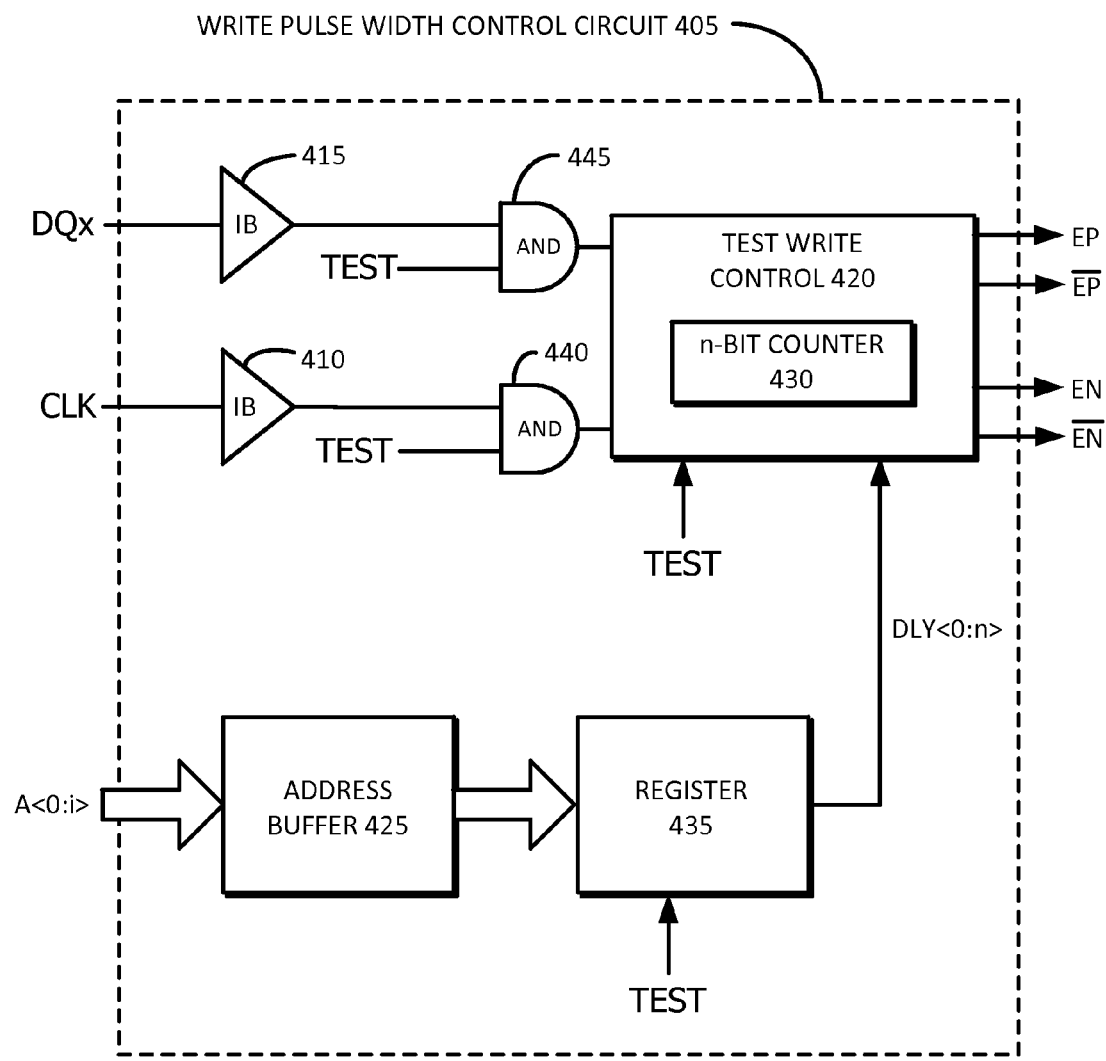
FIG. 6 is an example block diagram of a write pulse width control circuit, which may be included in the DFT circuitry of FIG. 1, in accordance with some embodiments of the inventive concept.

FIG. 6 is an example block diagram of a write pulse width control circuit 405, which may be included in the DFT circuitry 115 of FIG. 1, in accordance with some embodiments of the inventive concept. In some embodiments, the test control signals (e.g., EP, EP\, EN, and/or EN\) can be provided by external automated test equipment (ATE) to the DFT circuitry 115 of the memory device 105, and therefore, the write pulse width control circuit 405 is optional. It is advantageous, however, to include the write pulse width control circuit 405 in the DFT circuitry 115 because the memory device 105 can then be tested with minimal external circuitry or test equipment.

As mentioned above, the memory device 105 (of FIG. 1) can include an array of memory cells 110 and the DFT circuitry 115. The DFT circuitry 115 can include one or more constant current drivers (e.g., 135 of FIG. 3), each of which is configured to drive bit lines of the array of memory cells with test write currents in different directions or polarities, as explained in detail above. The DFT circuitry 115 can also include the write pulse width control circuit 405, which provides test control signals (e.g., EP, EP\, EN, and/or EN\) to the one or more constant current drivers.

The write pulse width control circuit 405 can include a variety of components, such as a first input buffer 410, which can receive a clock signal CLK, and a second input buffer 415, which can receive a signal from a repurposed input/output DQ pin, such as a DQx pin. In some embodiments, the DQx pin corresponds to the DQ0 pin, although other DQ pins can be used. An address buffer 425 of the write pulse width control circuit 405 can receive A<0:i> address signals. A test write control circuit 420 is coupled to the first input buffer 410, the second input buffer 415, and the address buffer 425, and configured to generate the plurality of test control signals (e.g., EP, EP\, EN, and/or EN\) based at least on the clock signal CLK, the signal from the repurposed DQx pin, and the A<0:i> address signals. In one embodiment, the DQ0 pin is used to determine the polarity of the read and/or write current, and the CLK high period is used to determined the read and/or write pulse width. When an input test signal TEST is not asserted (e.g., inactive or LOW), the test control signal EP can be forced HIGH and the test control signal EN can be forced LOW, which tri-states the current driver. When the input test signal TEST is asserted (e.g., active or HIGH), the current driver control circuit 145 can be enabled, and depending on the state of DQO, either EP is forced active LOW or EN is forced active HIGH. In a synchronous operation, the n-bit counter (where n can be 2 or more) can be used to generate a pulse width delay.

The test write control circuit 420 further includes an n-bit counter 430. The write pulse width control circuit 405 can further include a register 435 coupled to the address buffer 425 and the test write control circuit 420. The register 435 can control the timing of the pulse. The register 435 also generates DLY<0:n> signals based on the A<0:i> address signals. The DLY<0:n> signals may be used to select the output of the n-bit counter. For example, DLY<1> may select the output of the least significant bit of the counter, thereby producing the shortest pulse width coming out of the counter. DLY<2> may select the second least significant bit, and so on. DLY<0> may be used to by-pass the counter and select the CLK period as the shortest pulse width. The output of the n-bit counter 430 and the period of the clock signal are used to determine active times of each of the test control signals.

A first logic AND gate 440 can be coupled to the first input buffer 410 and the test write control circuit 420, and can receive the clock signal CLK and an input test signal TEST as inputs, and can reproduce the clock signal CLK when the input test signal TEST is asserted. A second logic AND gate 445 can be coupled to the second input buffer 415 and the test write control circuit 420, and can receive the signal from the repurposed DQx pin and the input test signal TEST as inputs, and can reproduce the signal from the repurposed DQx pin when the input test signal TEST is asserted. The test write control circuit 420 can receive the clock signal CLK, the signal from the repurposed DQx pin, and the input test signal TEST, and can generate the plurality of test control signals (e.g., EP, EP\, EN, and/or EN\) based at least on the clock signal CLK, the signal from the repurposed DQx pin, and the input test signal TEST. The constant current driver (e.g., 135 of FIG. 3) can receive the plurality of test control signals from the test write control circuit 420 of the write pulse width control circuit 405.

In some embodiments, a direction or polarity of the write test currents is based at least on the signal from the repurposed DQ pin. In addition, a pulse width of the write test currents is based at least on the high period of the clock signal.

The constant current driver (e.g., 135 of FIG. 3) can be tri-stated by the test control signals (e.g., EP, EP\, EN, and/or EN\) when the input test signal TEST is not asserted. For example, when the input test signal TEST is not asserted (e.g., inactive or LOW), the EP test control signal can be asserted (e.g., forced to a HIGH logic state) and the EN test control signal can be not asserted (e.g., forced to a LOW logic state), thereby tri-stating the constant current drivers. Conversely, when the input test signal TEST is asserted (e.g., active or HIGH), the EP test control signal and/or the EN test control signal can be asserted depending on the phase of the test mode.

The input test signal TEST can be asserted using conventional mode register set (MRS) techniques. Similarly, MRS techniques can be used to enable or otherwise reassign the repurposed DQx pin, and/or to enable the CLK signal. Moreover, the test write control circuit 420 can be controlled by external ATE equipment and/or by an internal smart memory controller.

FIG. 7A is a flow diagram 500 showing a technique for massive parallel testing of memory cells, in accordance with some embodiments of the inventive concept. The technique begins at 505, where it is determined whether the operating mode is a test mode. If NO, the flow proceeds to 510 where read and/or write operations proceed under a normal operating mode.

Otherwise, if YES, a fast error stress test mode is enabled, and the flow proceeds to 515, which includes disabling one or more internal analog voltage generators such as the internal VCP voltage generator. The flow then proceeds to 520, which includes coupling bit lines of the resistive type memory cells to the constant current driver. At 525, source lines of the memory cells are coupled to the VCP pad or external pin. Blocks 530 and 535 include holding the VCP pad or external pin at a test write voltage level for a period of time associated with a first write pulse width while the constant current driver pulls the bit lines to a ground voltage level. At 540, a first test current is forced to flow in a first direction through the memory cells. The flow proceeds to 545, where first data is written to the memory cells, and then read back to verify whether any of the memory cell bits did not flip. In other words, the memory bits are expected to flip, and if they do not flip, such condition for that memory cell can be recorded, and a redundant memory cell can be assigned in its place.

Blocks 550 and 555 include holding the VCP pad or external pin at the ground voltage level for a second write pulse width or time while the constant current driver pulls the bit lines to the test write voltage level. At 560, a second test current is forced to flow in a second direction opposite to the first direction through the memory cells, thereby causing second data opposite to the first data to be written to the memory cells at 565, and then read back to verify whether any of the memory cell bits did not flip. In other words, the memory bits are expected to flip, and if they do not flip, such condition for that memory cell can be recorded, and a redundant memory cell can be assigned in its place.

Figure 7B:
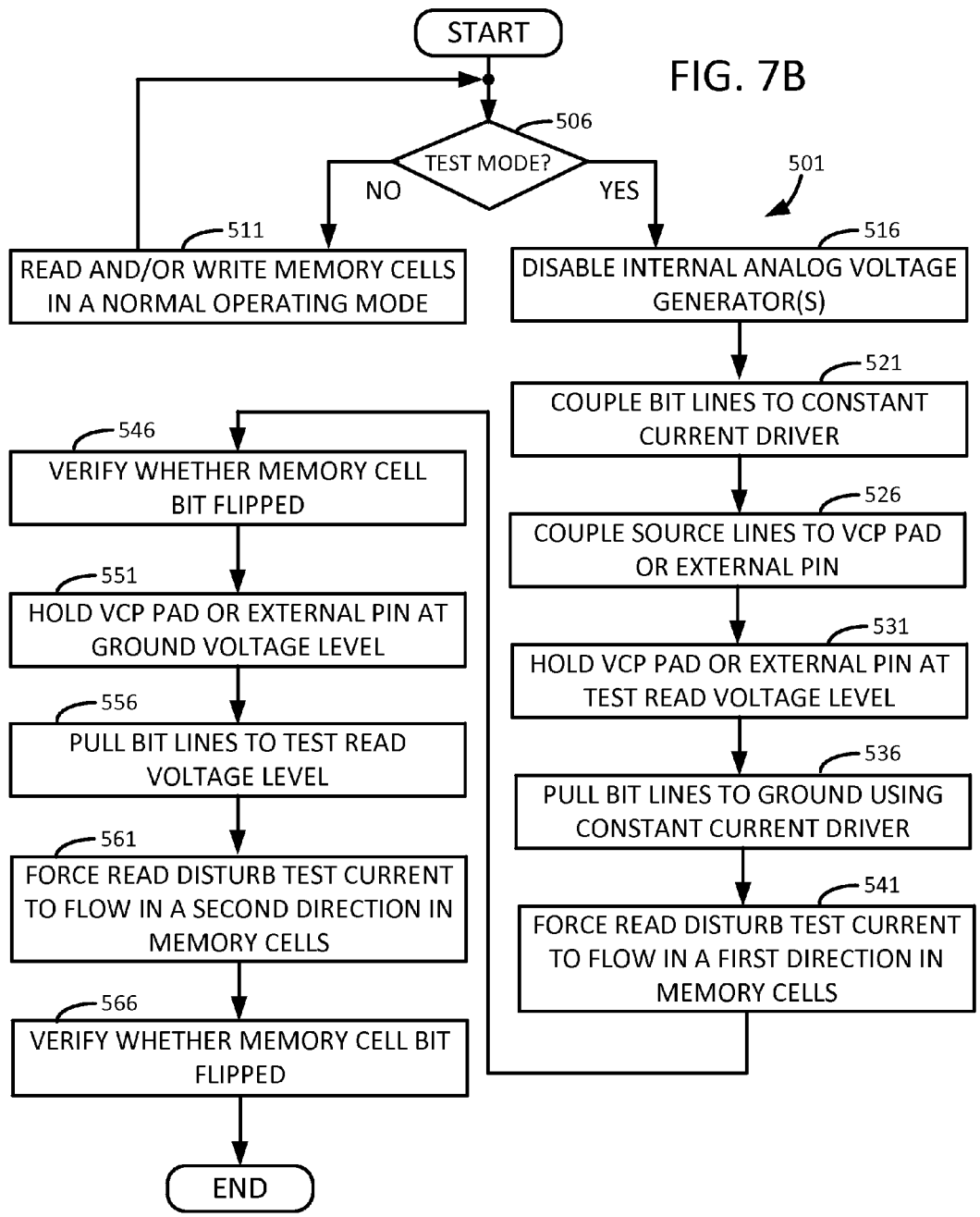

FIG. 7B is a flow diagram 501 showing a technique for massive parallel testing of memory cells, in accordance with some embodiments of the inventive concept. The technique begins at 506, where it is determined whether the operating mode is a test mode. If NO, the flow proceeds to 511 where read and/or write operations proceed under a normal operating mode.

Otherwise, if YES, a fast error stress test mode is enabled, and the flow proceeds to 516, which includes disabling one or more internal analog voltage generators such as the internal VCP voltage generator. The flow then proceeds to 521, which includes coupling bit lines of the resistive type memory cells to the constant current driver. At 526, source lines of the memory cells are coupled to the VCP pad or external pin. Blocks 531 and 536 include holding the VCP pad or external pin at a test read voltage level for a period of time associated with the first read pulse width while the constant current driver pulls the bit lines to a ground voltage level. At 541, a read disturb test current is forced to flow in a first direction through the memory cells. The flow proceeds to 546, where the data is read back to verify whether any of the memory cell bits flipped. In other words, the memory bits are expected not to flip, and if they do flip, such condition for that memory cell can be recorded, and a redundant memory cell can be assigned in its place.

Blocks 551 and 556 include holding the VCP pad or external pin at the ground voltage level for a second read pulse width or time while the constant current driver pulls the bit lines to the test read voltage level. At 561, the read disturb test current is forced to flow in a second direction opposite to the first direction through the memory cells. The flow then proceeds to 566, where the data is read back to verify whether any of the memory cell bits flipped. In other words, the memory bits are expected not to flip, and if they do flip, such condition for that memory cell can be recorded, and a redundant memory cell can be assigned in its place.

Figure 8:
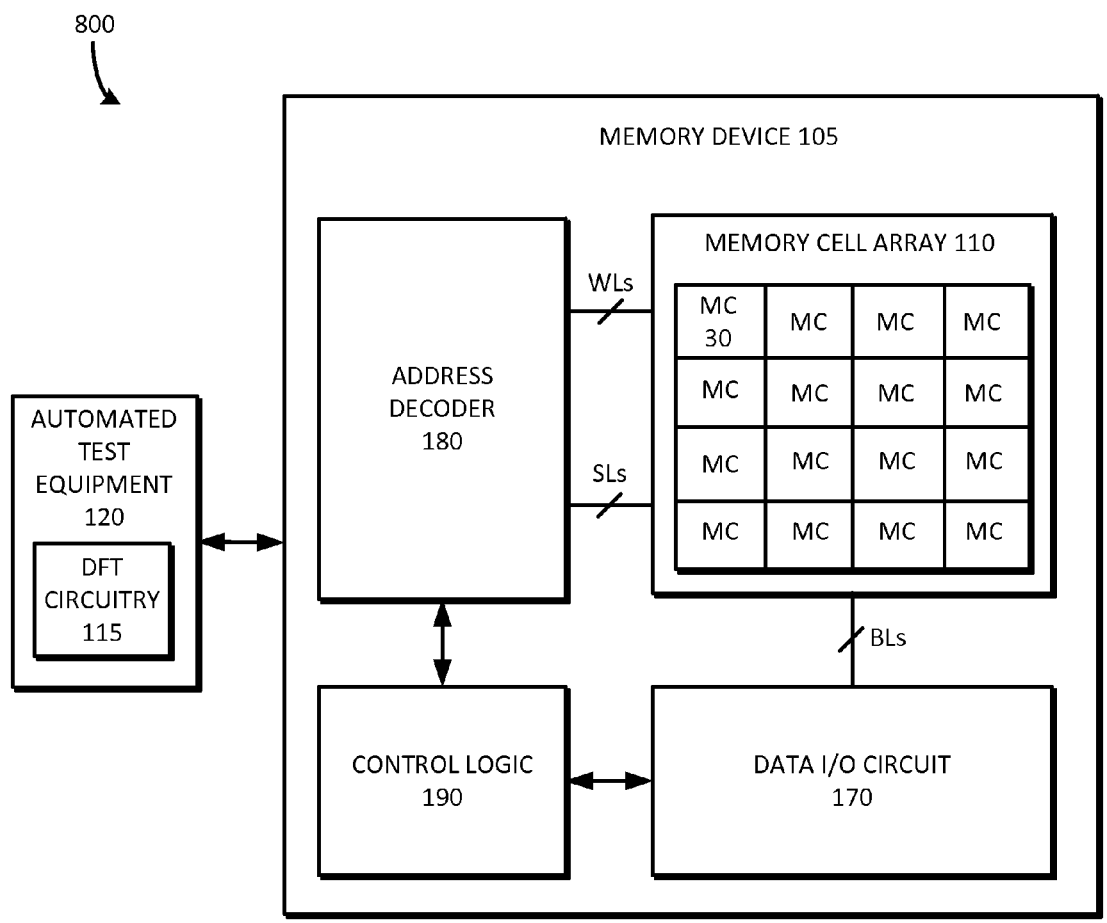
FIG. 8 is an example block diagram of a memory test system including a memory device and automated test equipment (ATE) having design for test (DFT) circuitry for testing memory cells of the memory array, in accordance with embodiments of the inventive concept.

FIG. 8 is an example block diagram of a memory test system 800 including a memory device 105 and ATE 120 having design for test (DFT) circuitry 115 for testing memory cells of the memory array, in accordance with embodiments of the inventive concept. The memory test system 800 is similar to the memory test system 100 of FIG. 1, and therefore, a detail description of its components is omitted. Referring to FIG. 8, the DFT circuitry 115 can be associated with or otherwise located in the ATE 120, thereby providing greater host-side control over the inventive testing concepts disclosed herein. It will be understood that some or all of the components of the DFT circuitry 115 can be associated with or otherwise located in the ATE 120. It will also be understood that some of the components of the DFT circuitry 115 can be associated with or otherwise located in the memory device 105 and some of the components of the DFT circuitry 115 can be located in the ATE 120. The massive parallel testing features and concepts disclosed herein can be implemented and controlled irrespective of the actual location of the DFT circuitry 115.

Figure 9:
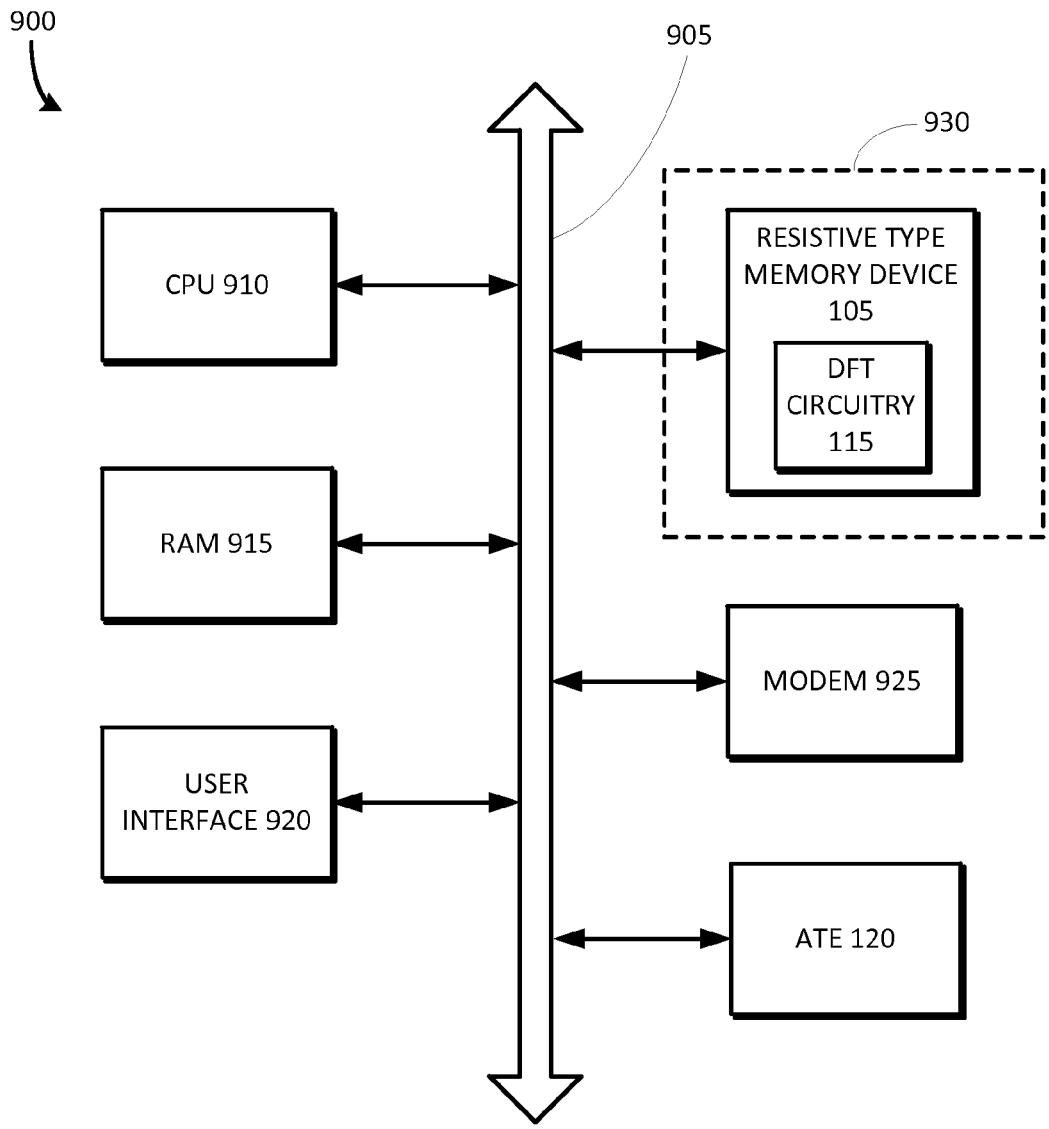
FIG. 9 is a block diagram of a computing system including a resistive type memory device having DFT circuitry according to embodiments of the inventive concept.

FIG. 9 is a block diagram of a computing system 900 including a resistive type memory device 105 having DFT circuitry 115 according to embodiments of the inventive concept as disclosed herein. Referring to FIG. 9, the computing system 900 may also include a central processing unit (CPU) 910, a random access memory (RAM) 915, a user interface 920, a modem 925 such as a baseband chipset, and/or ATE 120, which may be electrically coupled to a system bus 905. The resistive type memory device 105, including the DFT circuitry 115 as set forth herein, may also be electrically coupled to the system bus 905. The resistive type memory device 105 may be enclosed within a burn-in oven 930, or other suitable temperature cycling appliance, for adjusting the test environment temperature, as described in detail above.

The above embodiments of the inventive concept are illustrative and not limitative. Various alternatives and equivalents are possible. The embodiments of the inventive concept are not limited by the type or the number of the magnetic random access memory cells included in a memory array. Nor are the embodiments of the inventive concept limited by the size of a parallel read or write. The embodiments of the inventive concept are not limited by the type of transistor, PMOS, NMOS or otherwise, included to select a magnetic tunnel junction device. The embodiments of the inventive concept are not limited by the type of logic gates, NOR or NAND included to implement logical column selection. The embodiments of the inventive concept are not limited by the type of integrated circuit in which the inventive concept may be disposed. Nor are the embodiments of the inventive concept limited to any specific type of process technology, e.g., CMOS, Bipolar, or BICMOS that may be included to manufacture a memory. The embodiments described herein have been directed to memory test circuits but are not limited thereto. The embodiments described herein may be included wherever improving the reliability of memory cells may be found useful.

What is claimed is:

1. A method for massive parallel testing of resistive type memories, the method comprising:
coupling bit lines of a plurality of resistive type memory cells to a current driver, and source lines of the memory cells to a common plane voltage (VCP) pad or external pin;
holding the VCP pad or external pin at a test write voltage level for a period of time associated with a test write pulse width while the current driver pulls the bit lines to a ground voltage level;
driving, in parallel, a first write test current to flow in a first direction through the memory cells to write first data to the memory cells;
holding the VCP pad or external pin at the ground voltage level for the test write pulse width or time while the current driver pulls the bit lines to the test write voltage level; and
driving, in parallel, a second write test current to flow in a second direction opposite to the first direction through the memory cells to write second data opposite to the first data to the memory cells.

2. A memory device, comprising:
a plurality of resistive type memory cells;
an internal analog voltage generator;
a common plane voltage (VCP) pad or external pin;
a switch configured to select either the internal analog voltage generator or the VCP pad or external pin to be coupled to source lines of the memory cells responsive to a first test control signal;
a current driver; and
a transistor associated with each of a plurality of bit lines, each transistor configured to couple a corresponding bit line to the current driver responsive to a second test control signal.

3. The memory device of claim 2, wherein the first and second test control signals are configured to provide a fast error stress test mode.

4. The memory device of claim 2, wherein:
the VCP pad or external pin is configured to be held at a test write voltage level for a period of time associated with a first write pulse width while the current driver is configured to pull the bit lines to a ground voltage level;
the VCP pad or external pin and the current driver are configured to drive a first write test current to flow in a first direction through the memory cells; and
the VCP pad or external pin and the current driver are configured to write, in parallel, first data to the memory cells.

5. The memory device of claim 4, wherein:
the VCP pad or external pin is configured to be held at the ground voltage level for a second write pulse width or time while the current driver is configured to pull the bit lines to the test write voltage level;
the VCP pad or external pin and the current driver are configured to drive a second write test current to flow in a second direction opposite to the first direction through the memory cells; and
the VCP pad or external pin and the current driver are configured to write, in parallel, second data opposite to the first data to the memory cells.

6. The memory device of claim 5, wherein:
the first and second write test currents are X % of a normal write current, wherein X is less than 100; and
the first and second write pulse widths or times are shorter than a normal write pulse width or time.

7. The memory device of claim 2, wherein:
the VCP pad or external pin and the current driver are configured to initialize, in parallel, either first data or second data to the memory cells by driving, in parallel, an initialization current through the memory cells.

8. The memory device of claim 7, wherein:
the VCP pad or external pin and the current driver are configured to screen for read errors in the memory cells by driving, in parallel, a read disturb test current through the memory cells.

9. The memory device of claim 8, wherein:
the VCP pad or external pin and the current driver are further configured to drive, in parallel, the read disturb test current to flow in the first or second direction through the memory cells; and
the memory device further comprising circuitry configured to:
read the first or second data from each of the memory cells using a normal read current; and
verify the accuracy of the first or second data in a read compression mode.

10. The memory device of claim 9, wherein:
the read disturb current is X % of a normal read current, wherein X is greater than 100.

11. The memory device of claim 9, wherein the VCP pad or external pin and the current driver are further configured to:
hold the VCP pad or external pin at a test read voltage level for a period of time associated with a test read pulse width while the current driver pulls the bit lines to the ground voltage level, wherein the test read pulse width or time is longer than a normal read pulse width or time.

12. The memory device of claim 9, wherein the VCP pad or external pin and the current driver are further configured to:
hold the VCP pad or external pin at the ground voltage level for a test read pulse width or time while the current driver pulls the bit lines to the test read voltage level, wherein the test read pulse width or time is longer than a normal read pulse width or time.

13. The memory device of claim 2, wherein the plurality of memory cells include substantially all memory cells of the memory device.

14. The memory device of claim 2, wherein the plurality of memory cells include substantially all memory cells of a memory block that includes at least 1024 memory cells.

15. The memory device of claim 2, wherein the resistive type memory cells include at least one of a spin transfer torque (STT) magnetoresistive random-access memory (MRAM) cell, an MRAM cell, a phase change RAM cell, a memristor RAM cell, an ReRAM cell, or a CBRAM cell.

16. The memory device of claim 2, wherein the current driver is a constant current driver.

17. The memory device of claim 2, wherein the current driver is a first current driver, the device further comprising:
a second current driver,
wherein the first current driver is coupled to even bit lines and the second current driver is coupled to odd bit lines; and
wherein the first and second current drivers are configured to cause current to simultaneously flow in a first direction through memory cells associated with the even bit lines and in a second direction opposite to the first direction through memory cells associated with the odd bit lines.

18. The memory device of claim 2, wherein:
the VCP pad or external pin comprises a first VCP pad or external pin; and
the current driver is coupled to a second VCP pad or external pin.

19. A memory device, comprising:
an array of resistive type memory cells; and
design for test circuitry, including:
a current driver configured to drive bit lines of the array of memory cells with a first test write current level in a first direction and a second test write current level in a second direction; and
a write pulse width control circuit configured to provide a plurality of test control signals to the current driver.

20. The memory device of claim 19, wherein the write pulse width control circuit further comprises:
a first input buffer configured to receive a clock signal;
a second input buffer configured to receive a signal from a repurposed input/output DQx pin;
an address buffer configured to receive A<0:i> address signals; and
a test write control circuit coupled to the first input buffer, the second input buffer, and the address buffer, and configured to generate a plurality of test control signals based at least on the clock signal, the signal from the repurposed DQx pin, and the A<0:i> address signals.

21. The memory device of claim 20, wherein:
the test write control circuit further includes an n-bit counter;
the write pulse width control circuit further includes a register coupled to the address buffer and the test write control circuit;
the register is configured to generate DLY<0:n> signals based on the A<0:i> address signals;
an output of the n-bit counter is generated based on the DLY<0:n> signals; and
the output of the n-bit counter and the period of the clock signal are used to determine active times of each of the test control signals.

22. The memory device of claim 20, further comprising:
a first logic gate coupled to the first input buffer and the test write control circuit and configured to receive the clock signal and an input test signal as inputs, and to reproduce the clock signal when the input test signal is asserted; and
a second logic gate coupled to the second input buffer and the test write control circuit and configured to receive the signal from the repurposed DQx pin and the input test signal as inputs, and to reproduce the signal from the repurposed DQx pin when the input test signal is asserted.

23. The memory device of claim 22, wherein:
the test write control circuit is configured to receive the clock signal, the signal from the repurposed DQx pin, and the input test signal, and to generate the plurality of test control signals based at least on the clock signal, the signal from the repurposed DQx pin, and the input test signal; and
the current driver is configured to receive the plurality of test control signals from the test write control circuit.

24. The memory device of claim 23, wherein:
a polarity of a test write current is based at least on the signal from the repurposed DQx pin; and
a write pulse width or time is based at least on the high period of the clock signal.

25. The memory device of claim 23, wherein the current driver is configured to be tri-stated by the plurality of test control signals when the input test signal is not asserted.

26. The memory device of claim 19, wherein the resistive type memory cells include at least one of a spin transfer torque (STT) magnetoresistive random-access memory (MRAM) cell, an MRAM cell, a phase change RAM cell, a memristor RAM cell, an ReRAM cell, or a CBRAM cell.

* * * * *